(12) United States Patent
Alvi et al.

(10) Patent No.: US 11,671,087 B2
(45) Date of Patent: Jun. 6, 2023

(54) SHORT CIRCUIT PROTECTION FOR BIDIRECTIONAL SWITCHES

(71) Applicant: GM GLOBAL TECHNOLOGY OPERATIONS LLC, Detroit, MI (US)

(72) Inventors: Muhammad Hussain Alvi, Troy, MI (US); Chandra S. Namuduri, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 120 days.

(21) Appl. No.: 17/387,084

(22) Filed: Jul. 28, 2021

(65) Prior Publication Data
US 2023/0033695 A1    Feb. 2, 2023

(51) Int. Cl.
*H03K 17/081*    (2006.01)
*H02M 1/32*    (2007.01)
*H03K 17/687*    (2006.01)

(52) U.S. Cl.
CPC .......... *H03K 17/081* (2013.01); *H02M 1/32* (2013.01); *H03K 17/6874* (2013.01)

(58) Field of Classification Search
CPC .... H03K 17/081; H03K 17/6874; H02M 1/32

USPC .......................................... 361/115
See application file for complete search history.

(56) References Cited

U.S. PATENT DOCUMENTS

| | | | |
|---|---|---|---|
| 9,214,934 B2 * | 12/2015 | Cottell | H03K 17/0826 |
| 10,256,806 B2 * | 4/2019 | Jaksic | H02P 27/06 |
| 10,473,710 B2 * | 11/2019 | Sullivan | G01R 31/2619 |
| 2009/0153223 A1 * | 6/2009 | Bayerer | H03K 17/567 |
| | | | 327/389 |

* cited by examiner

*Primary Examiner* — Yemane Mehari
(74) *Attorney, Agent, or Firm* — Cantor Colburn LLP (57) ABSTRACT

A bidirectional switch fault protection circuit includes a bidirectional switch circuit, a desaturation detection circuit, and a gate driver. The bidirectional switch circuit generates first and second switch voltages based on a direction of electric current. The desaturation detection circuit outputs the first switch voltage in response to the electric current flowing in a first direction and outputs the second switch voltage in response to the electric current flowing in a second direction opposite the first direction. The gate driver receives the first switch voltage in response to the electric current flowing in the first direction and the second switch voltage in response to the electric current flowing in the second direction. The gate driver detects a first short circuit condition based on the first switch voltage and a second short circuit condition based on the second switch voltage.

20 Claims, 6 Drawing Sheets

SHORT CIRCUIT PROTECTION FOR BIDIRECTIONAL SWITCHES

INTRODUCTION

The subject disclosure relates generally to automotive vehicles, and more particularly, to bidirectional fault current detection in an automotive vehicle.

Some types of vehicles include only an internal combustion engine that generates propulsion torque. Electric vehicles typically implement one or more electric motors, which can be used for propulsion. One or more power circuits are employed in a vehicle to provide battery power to a given electric motor.

Hybrid vehicles include both an internal combustion engine and one or more electric motors. Some types of hybrid vehicles utilize the electric motor and the internal combustion engine in an effort to achieve greater fuel efficiency than if only the internal combustion engine was used. Some types of hybrid vehicles also utilize the electric motor and the internal combustion engine to achieve greater torque output than the internal combustion could achieve by itself.

Some example types of hybrid vehicles include parallel hybrid vehicles, series hybrid vehicles, and other types of hybrid vehicles. In a parallel hybrid vehicle, the electric motor works in parallel with the engine to combine power and range advantages of the engine with efficiency and regenerative braking advantages of electric motors. In a series hybrid vehicle, the engine drives a generator to produce electricity for the electric motor, and the electric motor drives a transmission. This allows the electric motor to assume some of the power responsibilities of the engine, which permits the use of a smaller and possibly more efficient engine.

SUMMARY

In one exemplary embodiment, a bidirectional switch fault protection circuit comprises a bidirectional switch circuit configured to generate a first switch voltage in response to receiving an electric current flowing in a first direction and to generate a second switch voltage in response to receiving the electric current flowing in a second direction opposite the first direction. A desaturation detection circuit is electrically connected to the bidirectional switch circuit. The desaturation detection circuit is configured to output the first switch voltage in response to the electric current flowing in the first direction and to output the second switch voltage in response to the electric current flowing in the second direction. A gate driver is electrically connected to the desaturation detection circuit. The gate driver is configured to receive the first switch voltage in response to the electric current flowing in the first direction and to receive the second switch voltage in response to the electric current flowing in the second direction. The gate driver is configured to detect a first short circuit condition based on the first switch voltage and a second short circuit condition based on the second switch voltage.

In addition to one or more of the features described herein, the gate driver is configured to compare the first switch voltage to a short circuit voltage threshold in response to the electric current flowing in the first direction, and to detect the first short circuit condition in response to the first switch voltage exceeding the short circuit voltage threshold; and is configured to compare the second switch voltage to the short circuit voltage threshold in response to the electric current flowing in the second direction, and to detect the second short circuit condition in response to the second switch voltage exceeding the short circuit voltage threshold.

In addition to one or more of the features described herein, the short circuit voltage threshold has a negative value.

In addition to one or more of the features described herein, the gate driver includes an output electrically connected to the bidirectional switch circuit. The gate driver is configured to switch off one or both of the first and second switch voltages in response to detecting one or both of the first short circuit condition and the second short circuit condition.

In addition to one or more of the features described herein the bidirectional switch circuit comprises a first power semiconductor switch configured to generate the first switch voltage, and a second power semiconductor switch configured to generate the second switch voltage.

In addition to one or more of the features described herein, the gate driver is configured to switch off one or both of the first power semiconductor switch and the second power semiconductor switch in response to detecting one or both of the first short circuit condition and the second short circuit condition.

In addition to one or more of the features described herein, the gate driver includes a desaturation input. The desaturation input is electrically connected to the first power semiconductor switch to receive the first switch voltage having a negative voltage value and is electrically connected to the second power semiconductor switch to receive the second switch voltage having a negative voltage value.

In another exemplary embodiment, a bidirectional switch fault protection circuit comprises a bidirectional switch circuit configured to generate a first switch voltage in response to receiving an electric current flowing in a first direction and to generate a second switch voltage in response to receiving the electric current flowing in a second direction opposite the first direction. A desaturation detection circuit is electrically connected to the bidirectional switch circuit. The desaturation detection circuit is configured to output the first switch voltage in response to the electric current flowing in the first direction and to output the second switch voltage in response to the electric current flowing in the second direction. A gate driver is electrically connected to the desaturation detection circuit. The gate driver includes a first desaturation input configured to receive the first switch voltage in response to the electric current flowing in the first direction, and includes a second desaturation input configured to receive the second switch voltage in response to the electric current flowing in the second direction.

In addition to one or more of the features described herein, the gate driver is configured to detect a first short circuit condition based on the first switch voltage received at the first desaturation input and a second short circuit condition based on the second switch voltage received at the second desaturation input.

In addition to one or more of the features described herein, the gate driver is configured to compare the first switch voltage received at the first desaturation input to a first short circuit voltage threshold and to compare the second switch voltage received at the second desaturation input to a second short circuit voltage threshold. The gate driver is further configured to detect the first short circuit condition in response to the first switch voltage exceeding the first short circuit voltage threshold and to detect the second short circuit condition in response to the second switch voltage exceeding the second short circuit voltage threshold.

In addition to one or more of the features described herein, the first short circuit voltage threshold and the second short circuit voltage threshold each have a positive value.

In addition to one or more of the features described herein, the bidirectional switch circuit comprises a first power semiconductor switch configured to generate the first switch voltage, and a second power semiconductor switch configured to generate the second switch voltage.

In addition to one or more of the features described herein, the gate driver is configured to switch off one or both of the first power semiconductor switch and the second power semiconductor switch in response to detecting one or both of the first short circuit condition and the second short circuit condition.

In addition to one or more of the features described herein, the gate driver includes a first output electrically connected to the first power semiconductor switch and a second output electrically connected to the second power semiconductor switch. The gate driver is further configured to switch off the first power semiconductor switch in response to detecting the first short circuit condition and to switch off the second power semiconductor switch in response to detecting the second short circuit condition.

In yet another exemplary embodiment, a bidirectional switch fault protection circuit comprises a bidirectional switch circuit configured to generate a first switch voltage in response to receiving an electric current flowing in a first direction and to generate a second switch voltage in response to receiving the electric current flowing in a second direction opposite the first direction. A desaturation detection circuit is electrically connected to the bidirectional switch circuit. The desaturation detection circuit is configured to output the first switch voltage in response to the electric current flowing in the first direction and to output the second switch voltage in response to the electric current flowing in the second direction. A first gate driver and a second gate driver are electrically connected to the desaturation detection circuit. The first gate driver is configured to receive the first switch voltage in response to the electric current flowing in the first direction. The second gate driver is configured to receive the second switch voltage in response to the electric current flowing in the second direction.

In addition to one or more of the features described herein, the first gate driver is configured to detect a first short circuit condition based on the first switch voltage and the second gate driver is configured to detect a second short circuit condition based on the second switch voltage.

In addition to one or more of the features described herein, the first gate driver is configured to compare the first switch voltage to a first short circuit voltage threshold and to detect the first short circuit condition in response to the first switch voltage exceeding the first short circuit voltage threshold. The second gate driver is configured to compare the second switch voltage to a second short circuit voltage threshold and to detect the second short circuit condition in response to the second switch voltage exceeding the second short circuit voltage threshold.

In addition to one or more of the features described herein, the first short circuit voltage threshold and the second short circuit voltage threshold each have a positive value.

In addition to one or more of the features described herein, the bidirectional switch circuit comprises a first power semiconductor switch and a second power semiconductor switch. The first power semiconductor switch is configured to generate the first switch voltage. The second power semiconductor switch is configured to generate the second switch voltage.

In addition to one or more of the features described herein, the first gate driver is configured to switch off the first power semiconductor switch in response to detecting the first short circuit condition, and the second gate driver is configured to switch off the second power semiconductor switch in response to detecting the second short circuit condition.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features.

Automotive vehicles utilize alternating current (AC) electric power provided from a direct current (DC) electric current power source, such as a storage battery. In some power systems, gate drivers are implemented to control operation of a bidirectional switch circuit that includes a pair of opposing power semiconductor switches configured to perform bidirectional voltage blocking. The power semiconductor switches include, but are not limited to, insulated-gate bipolar transistors (IGBTs), junction field effect transistor (JFETs), metal oxide semiconductor field effect transistors (MOSFETs) which can be wide or ultra wide bandgap. The power semiconductor switches can be utilized to establish various power devices or circuits including, but not limited to, inverters, converters, relays and fuses.

In accordance with a non-limiting embodiment of the subject disclosure, a bidirectional switch fault protection circuit includes a desaturation detection circuit that connects a bidirectional switch circuit to one or more gate drivers configured to provide desaturation, bidirectional short circuit or over current protection. One or more of the gate drivers included in the bidirectional switch fault protection circuit are configured to perform desaturation voltage-based protection for the bidirectional switch circuit in response to detecting short circuit current flowing in either a positive direction or negative direction.

Figure 1:
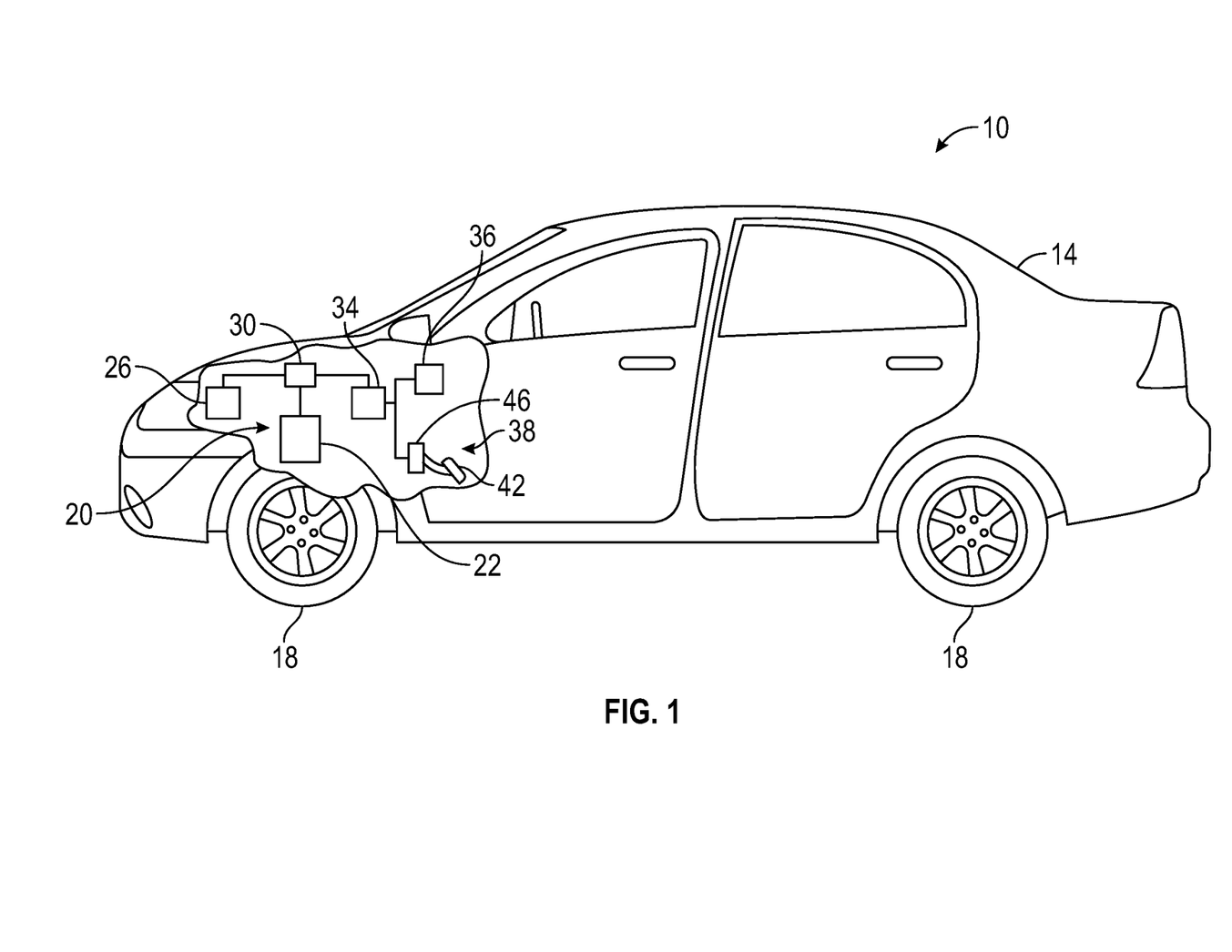
FIG. 1 illustrates an automotive vehicle according to a non-limiting embodiment of the subject disclosure.

Referring to FIG. 1, a vehicle 10 includes a vehicle body 14. The vehicle 10 also includes a plurality of wheels 18 that rotatably support the body 14 on the ground, (i.e., the surface on which the vehicle is resting or traveling). The vehicle 10 also includes a powertrain 20, including an electric motor 22. The electric motor 22 is operatively connected to at least one of the wheels 18 to transmit torque thereto and thereby propel the vehicle 10. The motor 22 can be connected to the wheel 18 directly or indirectly by a transmission system such as, for example, a multi-speed transmission. The powertrain 20 also includes an electrical power source, such as a battery 26, which supplies electrical energy for the motor 22.

In the depicted non-limiting embodiment, the powertrain 20 is a battery-electric powertrain, (i.e., the battery 26 is the only source of energy for powering the motor 22). However, other powertrain configurations having an electric motor can be employed within the scope of the embodiments described herein. For example, the powertrain can also be a hybrid-electric powertrain in which an engine also provides power to propel the vehicle, in series or in parallel with the motor 22, or to drive a generator source to produce AC or DC electric power that can be coupled to the motor 22.

According to a non-limiting embodiment, the motor 22 can be a permanent magnet motor that uses AC electric power. The battery 26 provides DC electric power. The powertrain 20 includes one or more power circuits 30 that are operatively connected to the battery 26. In at least one non-limiting embodiment, the power circuits 30 include, but are not limited to, solid state relays, an inverter and a converter. The solid state relays selectively connect and disconnect the battery 26, and can operate as an isolation contactor as well as a fuse. The inverter can include a DC-to-AC inverter, which is operatively connected to the motor 22. The inverter is configured to receive DC electric power from the battery 26, convert it to AC electric power, and deliver the converted AC power to the motor 22. The converter can include, but is not limited to, a DC-to-DC converter, which is configured to receive a DC voltage having a first voltage level and output a DC voltage having a second voltage level that is higher or lower than the first voltage level.

The powertrain 20 also includes a controller 34 that is operatively connected to the motor 22 and one or more of the power circuits 30 such that the controller 34 controls the motor 22 and a given power circuit 30. The controller 34 can be a general-purpose digital computer, generally including a microprocessor or central processing unit, one or more forms of memory, clock and synchronization circuitry, analog to digital (A/D) and digital to analog (D/A) circuitry, input/output circuitry and devices (I/O) and appropriate signal conditioning and buffer circuitry. The controller 34 can have a set of control algorithms, including resident program instructions and calibrations stored in the memory and executed to provide the respective functions of the controller 34. As used herein, a "controller" can include one or more controllers, microprocessors, central processing units, memory units and/or other devices that cooperate to perform the operations described herein.

The vehicle 10 also includes an input device 38 that is operable by a driver of the vehicle 10 to input a desired or requested torque output of the motor 22. In non-limiting the embodiment depicted, the input device 38 includes a foot pedal 42 that is selectively depressible. The input device 38 also includes a sensor 46 that determines the position of the pedal 42 and transmits a signal indicative of the position of the pedal 42 to the controller 34. Typically, a larger displacement of the pedal from a default position is indicative of a higher requested torque. When the pedal 42 is not depressed, then the requested torque is zero. The controller 34 controls the torque output of the motor 22 by regulating the amount of energy transmitted to the motor 22 from the battery 26 via the power circuit 30 (e.g., inverter) in response to the position of the pedal 42. The input device 38 can also include an output of an autonomous vehicle operation controller 36, which can control the vehicle to autonomously operate according to one or more of the vehicle operations described herein.

Figure 2:
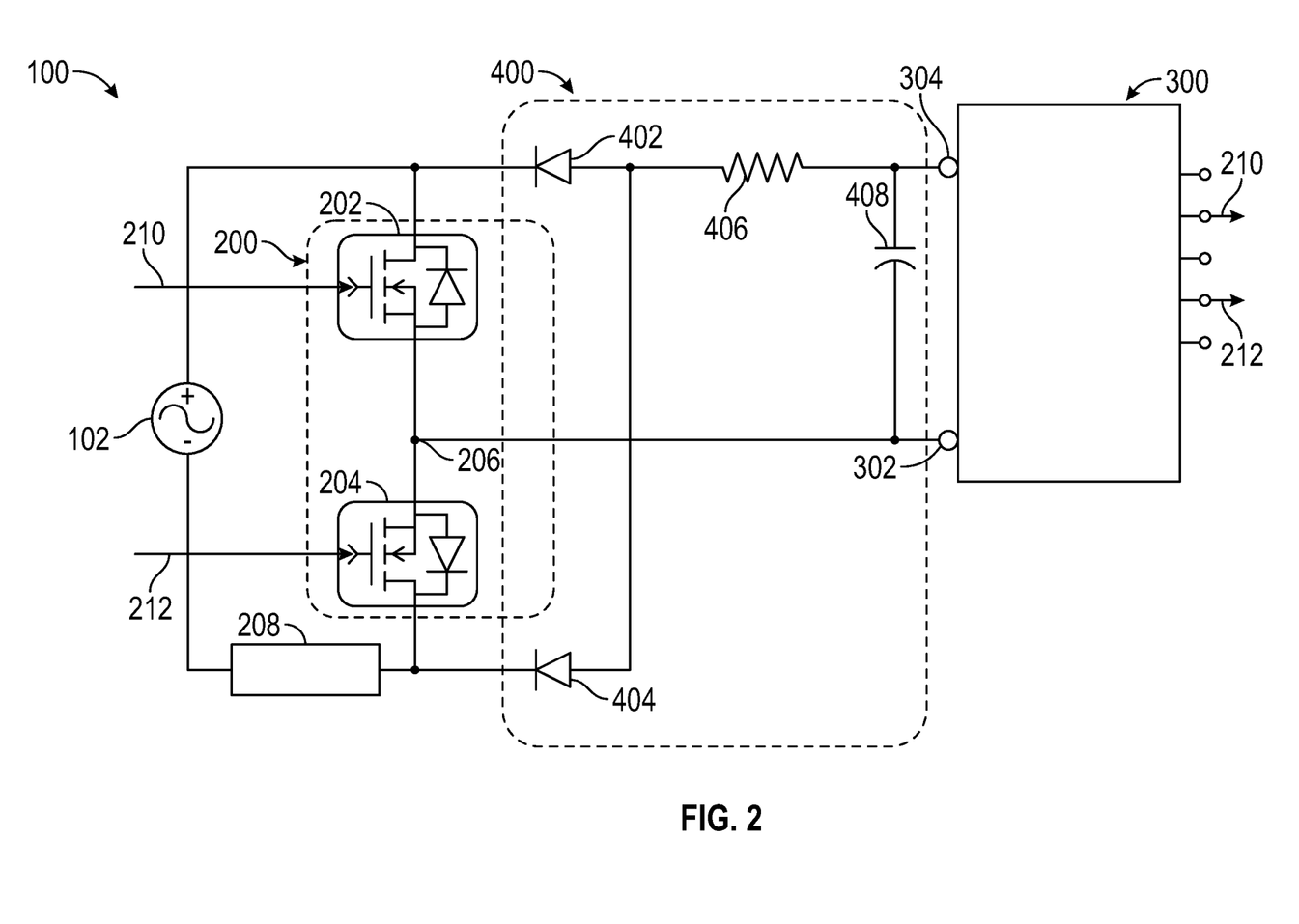
FIG. 2 is a schematic diagram of a bidirectional switch fault protection circuit according to a non-limiting embodiment of the subject disclosure.

Turning now to FIG. 2, a bidirectional switch fault protection circuit 100 is illustrated according to a non-limiting embodiment. The bidirectional switch fault protection circuit 100 includes a power supply 102, a bidirectional switch circuit 200, a gate driver 300, and a desaturation detection circuit 400. The power supply 102 is configured to output electric current. The electric current can be generated as alternating current (AC) or direct current (DC) and periodically reverses direction between a first direction or positive direction (e.g., from a positive voltage potential to a negative voltage potential) and an opposing second direction or negative direction (e.g., from a negative voltage potential to a positive voltage potential) and changes its magnitude continuously with time as understood by one of ordinary skill in the art.

The bidirectional switch circuit 200 is in electrical connection with the power supply to receive the electric current. The bidirectional switch circuit 200 can be implemented in various electrical devices or systems including, but not limited to, a power converter or a power inverter. For example, the bidirectional switch circuit 200 can be connected between the battery 26 and an inverter included in the power circuit 30 shown in FIG. 1.

The bidirectional switch circuit 200 includes a first power semiconductor switch 202 and a second power semiconductor switch 204. The first power semiconductor switch 202 and the second power semiconductor switch 204 can be connected back-to-back in series with one another to establish a bidirectional switch configured to perform four-quadrant switching operations. That is, the first power semiconductor switch 202 and the second power semiconductor switch 204 operate together to allow for conducting currents and blocking voltages of both polarities as understood by one of ordinary skill in the art. As described herein, the first power semiconductor switch 202 and a second power semiconductor switch 204 can be implemented as a first MOSFET 202 and a second MOSFET 204, respectively. The first and second MOSFETs 202 and 204 can be constructed using semiconductor materials including, but not limited to, silicon (Si), diamond, silicon carbide (SiC), gallium nitride (GaN), and boron nitride (BN). Although MOSFETS 202 and 204 are described herein, it should be appreciated that other types of power semiconductor switches such as insulated gate bipolar transistors (IGBTs) used in combination with corresponding diodes, or IGBTs or bipolar junction transistors (BJTs) used in combination with corresponding diodes can be employed without departing from the scope of the subject disclosure.

The first MOSFET 202 includes a first drain terminal and a first source terminal. The first drain terminal is connected to a positive terminal (+) of the power supply 102. The voltage across the first drain terminal (Vdrain1) and the first source terminal defines a first switch voltage (Vds1). The second MOSFET 204 includes a second drain terminal and a second source terminal. The second source terminal of the second MOSFET 204 is connected directly to the first source terminal of the first MOSFET 202, thereby establishing a source node 206. The second drain terminal (Vdrain2) of the second MOSFET 204 is connected to a negative terminal (−) of the power supply 102 via a load 208. In one or more non-limiting embodiments, the load 208 is an inverter motor system included in the vehicle 10. The voltage across the second drain terminal (Vdrain2) and the second source terminal defines a second switch voltage (Vds2).

Each of the first MOSFET 202 and the second MOSFET 204 further includes a gate configured to receive a respective control signal 210 and 212 from the gate driver 300. Although the first MOSFET 202 and the second MOSFET 204 are illustrated as receiving two independent control signals 210 and 212, it should be appreciated that in other examples the gates of the first MOSFET 202 and the second MOSFET 204 can received a single control signal.

The control signals 210 and 212 are configured to control the operation of the first MOSFET 202 and the second MOSFET 204. For example, the control signals 210 and 212 can continuously switch on and off the first MOSFET 202 and the second MOSFET 204 according to a target switching frequency. In addition, the gate driver 300 is configured to deactivate (i.e., maintain a given MOSFET in an off switch state) one or both of the first MOSFET 202 and the second MOSFET 204 in response to detecting at least one short circuit condition as described herein.

The gate driver 300 is connected to the bidirectional switch circuit 200 and the desaturation detection circuit 400. In the example shown in FIG. 2, the desaturation detection circuit 400 selectively delivers either the first switch voltage associated with the first MOSFET 202 or the second switch voltage associated with the second MOSFET 204 based on the direction of the electric current flowing through the bidirectional switch circuit 200. Accordingly, the gate driver 300 can detect a short circuit condition based on the first switch voltage or second switch voltage.

According to at least one non-limiting embodiment of the present disclosure, the gate driver 300 includes a source input (Vsource_IN) 302 and a desaturation input (DSAT) 304. The source input (Vsource_IN) 302 is connected to source node 206 to receive a source voltage present at the source node 206. The desaturation input (DSAT) 304 is configured to receive the first switch voltage associated with the first MOSFET 202 and the second switch voltage associated with the second MOSFET 204. The diodes 402 and 404 are arranged to selectively deliver the lower value among the first switch voltage (Vdrain1−Vsource) or the second switch voltage (Vdrain2−Vsource). In either case occurring in the example illustrated in FIG. 2, the first switch voltage and the second switch voltage have negative voltage values.

An occurring fault indicated by either the first switch voltage or the second switch voltage is processed by the gate driver 300 based on one or more short circuit thresholds associated with the gate driver 300. For example, the first switch voltage or the second switch voltage received at the desaturation input (DSAT) 304 is compared to the source voltage received at the source input (Vsource_IN) 302 to determine a differential voltage, which is then compared against a short circuit threshold voltage. According to the non-limiting embodiment illustrated in FIG. 2, the lower voltage level among the first switch voltage or the second switch voltage received at the desaturation input (DSAT) 304 is a negative voltage value. Accordingly, the short circuit threshold voltage utilized by the gate driver 300 is set to a negative value.

According to a non-limiting embodiment of the present disclosure, the desaturation input (DSAT) 304 receives the second switch voltage generated by the second MOSFET 204 when the electric current flows through the bidirectional switch circuit 200 in the first direction (e.g., from the power supply positive terminal (+) to the power supply negative terminal (−)). When, however, the electric current flows through the bidirectional switch circuit in the second direction (e.g., from the power supply negative terminal (−) to the power supply positive terminal (+)), the desaturation input (DSAT) 304 receives the first switch voltage generated by the first MOSFET 202. Accordingly, a single desaturation input (DSAT) 304 can be utilized to receive either the first switch voltage or the second switch voltage depending upon the direction of the electric current. In this manner, a desaturation detection circuit 400 capable of providing desaturation and bidirectional short circuit protection can be achieved while reducing the components and signal connections necessary to facilitate bi-directional short circuit detection.

The gate driver 300 also has an internal reference voltage which serves as a short circuit threshold voltage. In the example shown in FIG. 2, the internal reference voltage is a negative value. In other examples, however, the internal threshold reference voltage can be set as a positive threshold reference voltage. Accordingly, the gate driver 300 is configured to compare the first switch voltage or the second switch voltage to the threshold reference voltage and detect the short circuit event in response to at least one of the first or second switch voltages being more negative than the threshold reference voltage. In this manner, the gate driver 300 can provide the bidirectional switch circuit 200 with desaturation and bidirectional short circuit protection in response to detecting a short circuit.

For example, the gate driver 300 includes a first output in signal communication with the first MOSFET 202 to deliver the first control signal 210, and a second output in signal communication with the second MOSFET 204 to deliver the second control signal 212 independently from the first control signal 210. The first and second control signals 210 and 212 allow the gate driver 300 to control the first MOSFET 202 and the second MOSFET 204. According to at least one non-limiting embodiment of the present disclosure, the gate driver 300 is configured to switch off one or both of the first and second switch voltages by switching off (i.e., deactivating) one or both of the first MOSFET 202 and the second MOSFET 204 in response to detecting at least one short circuit condition among a plurality of short circuit conditions. As described herein, the plurality of short circuit conditions include, for example, a first short circuit condition defined by the electric current flowing through the bidirectional switch circuit 200 in a first direction (e.g., from the power supply positive terminal (+) to the power supply negative terminal (−)) and a second short circuit condition defined by the electric current flowing through the bidirectional switch circuit 200 in a second direction (e.g., from the power supply negative terminal (−) to the power supply positive terminal (+)).

The desaturation detection circuit 400 includes first desaturation diode 402, second desaturation diode 404, a desaturation resistor 406, and a desaturation capacitor 408. The first desaturation diode 402 includes a first cathode connected to the first drain terminal of the first MOSFET 202, and a first anode connected to the desaturation resistor 406. The second desaturation diode 404 includes a second cathode connected in common with the load 208 and the second drain terminal of the second MOSFET 204. The anode of the second desaturation diode 404 is connected in common with the first anode of first desaturation diode 402 and the desaturation resistor 406.

The desaturation resistor 406 includes a first terminal connected to the desaturation input (DSAT) 304 of the gate driver 300. The second terminal desaturation resistor 406 is connected in common with the first anode of the first desaturation diode 402, and the second anode of the second desaturation diode 404. The desaturation resistor 406 fine-tunes either the first switch voltage or the second switch voltage, and delivers the fine-tuned switch voltage to the desaturation capacitor 408. Accordingly, the desaturation resistor 406 can serve to dynamically set the compatibility between the first and second MOSFETs 202, 204 and the gate driver 300 by adjusting the voltage that appears at the desaturation input (DSAT) 304 rather than replacing the entire gate driver 300 with a different gate driver that has an internal threshold that is compatible with the first and second MOSFETs 202 and 204.

The value of the desaturation resistor 406 also sets a resistance for implementation with the gate driver 300. The resistance value can be selected by implementing a resistor having a resistance targeted for the particular application of the bidirectional switch fault protection circuit 100 or can be implemented as a variable resistor having a resistance that can be dynamically adjusted or preset by design. In either instance, the selected resistance of the desaturation resistor 406 can be utilized to set the voltage appearing at the desaturation input (DSAT) 304 to a targeted positive value or a targeted negative value, which can be used without being changed for every application.

The desaturation capacitor 408 includes a first terminal connected in common with the source node 206 and the gate driver source input (Vsource_IN) 302. The opposing second terminal is connected in common with the first terminal of the desaturation resistor 406 and the gate driver desaturation input (DSAT) 304. An occurring fault indicated by either the first switch voltage or the second switch voltage appears across the capacitor 408, and is input to the gate driver 300 via the desaturation input (DSAT) 304. The desaturation capacitor 408 further operates to provide a blanking time when the first and second MOSFETs 202 and 204 are switched on so that high switch voltages or transients do not cause a false short detection.

Figure 3:
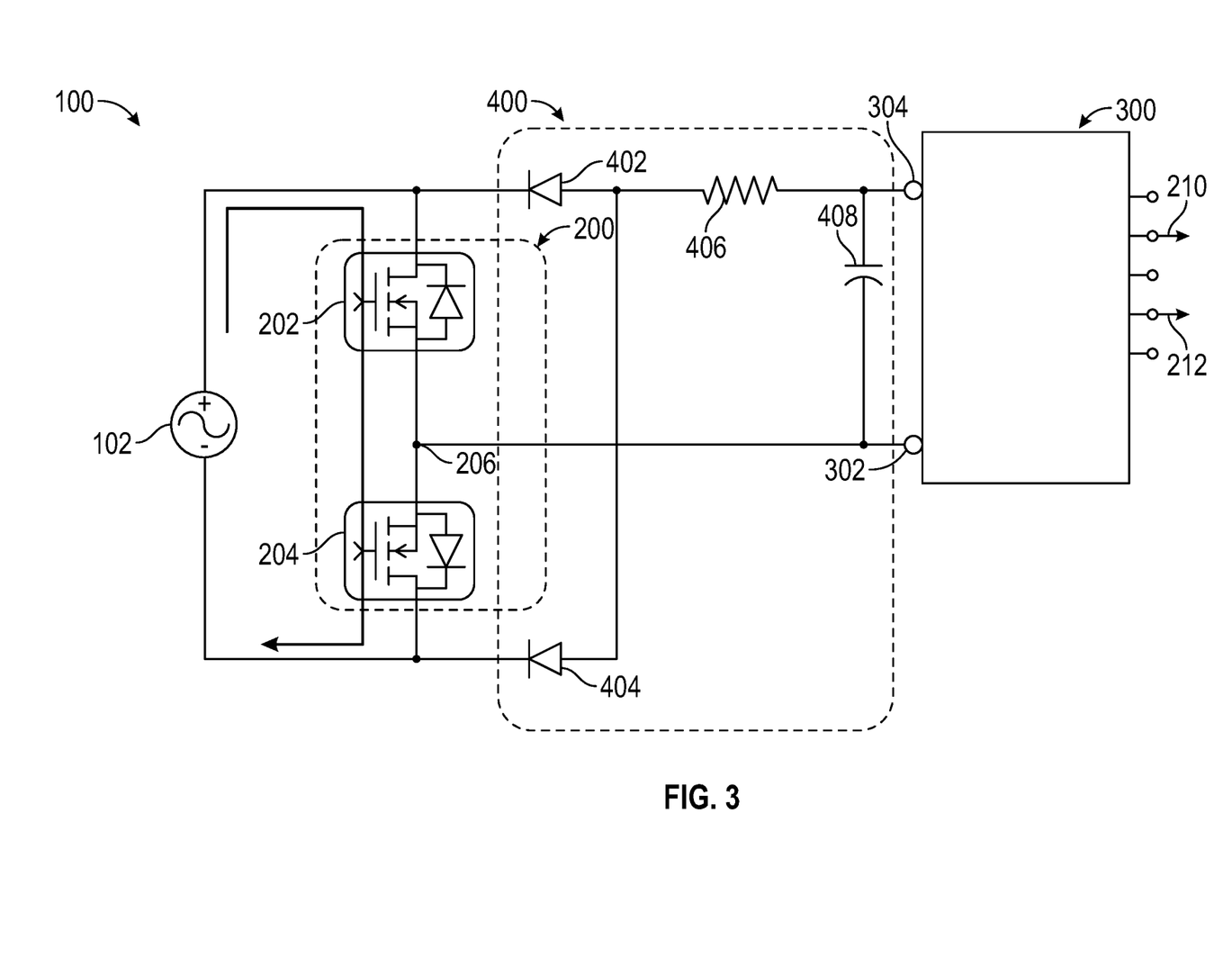
FIG. 3 is a schematic diagram illustrating the operation of the bidirectional switch fault protection circuit shown in FIG. 2 according to a non-limiting embodiment of the subject disclosure.
Figure 4:
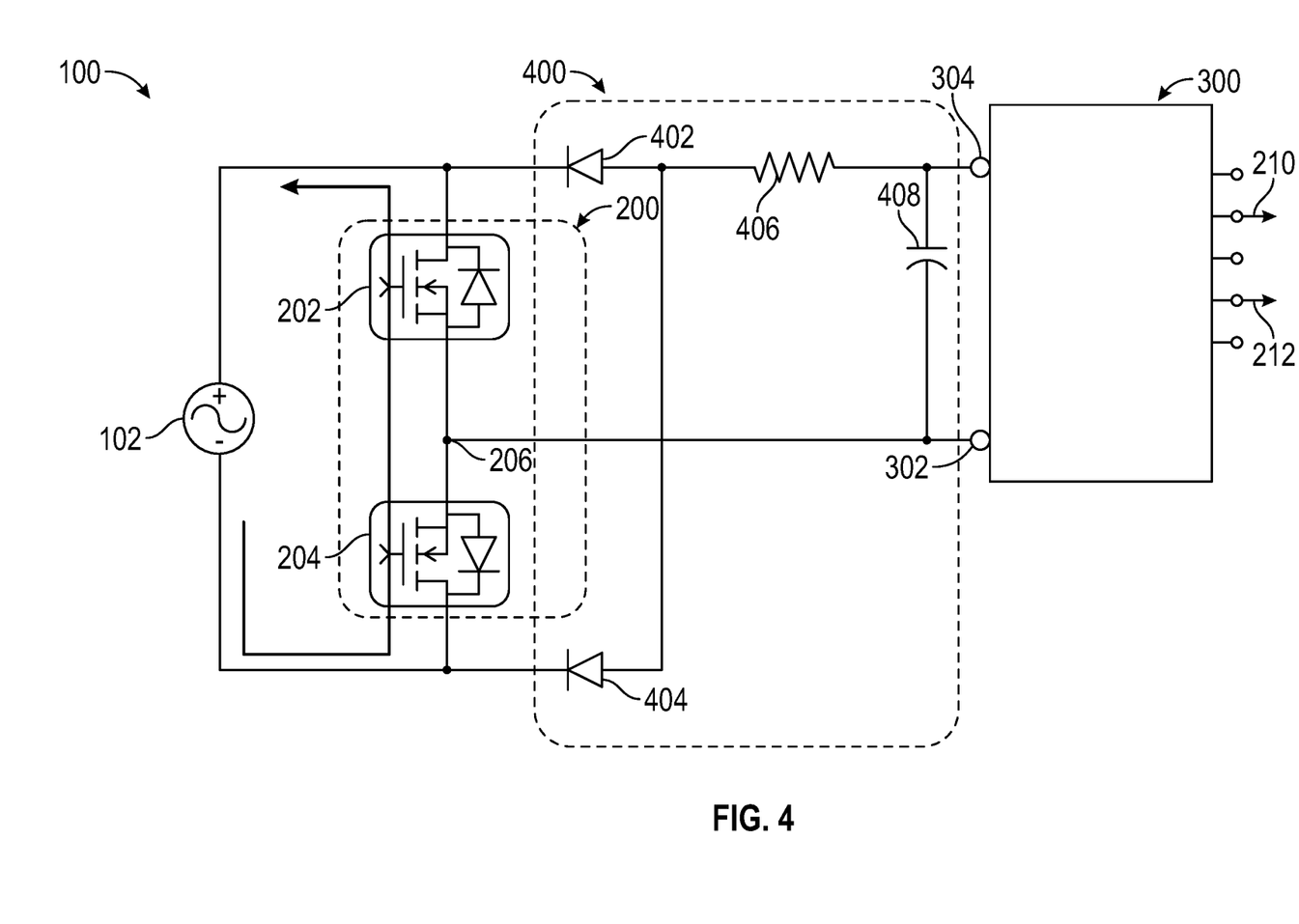
FIG. 4 is a schematic diagram illustrating the operation of the bidirectional switch fault protection circuit shown in FIG. 2 according to a non-limiting embodiment of the subject disclosure.

As described herein, the desaturation detection circuit 400 provides the first or second switch voltages to the gate driver 300 based on the direction of electric current flowing through the bidirectional switch circuit 200. When, for example, the electric current flows in the positive direction, (i.e., from the positive power supply terminal (+) to the negative power supply terminal (−) (see FIG. 3)), the loop including the second desaturation diode 404 operates to deliver the second switch voltage to the desaturation input (DSAT) 304. When, however, the electric current flows in the negative direction, (i.e., from the negative power supply terminal (−) to the positive power supply terminal (+) (see FIG. 4)), the first desaturation diode 402 operates to deliver the first switch voltage to the desaturation input (DSAT) 304.

In either scenario, the gate driver 300 compares the first switch voltage or the second switch voltage to the threshold reference voltage (e.g., a negative threshold reference voltage value in this example) and can detect a short circuit condition when either the first switch voltage or the second switch voltage reaches a voltage level that is beyond the threshold reference voltage. If the threshold reference voltage is set to negative 2.5 volts (−2.5V) for the example embodiments illustrated in FIGS. 2, 3 and 4, the gate driver 300 detects a short circuit condition when either the first switch voltage or the second switch voltage reaches a voltage level beyond negative 2.5 volts (−2.5V), e.g., if the first or second switch voltages reach a voltage level of negative 3 volts (−3V). In response to detecting the short circuit condition, the gate driver 300 can deactivate one or both of the first and second MOSFETs 202 and 204 as described herein. In this manner, the gate driver 300 can perform desaturation voltage-based protection for the bidirectional switch circuit in response to detecting short circuit current flowing in either a positive direction or negative direction.

Figure 5:
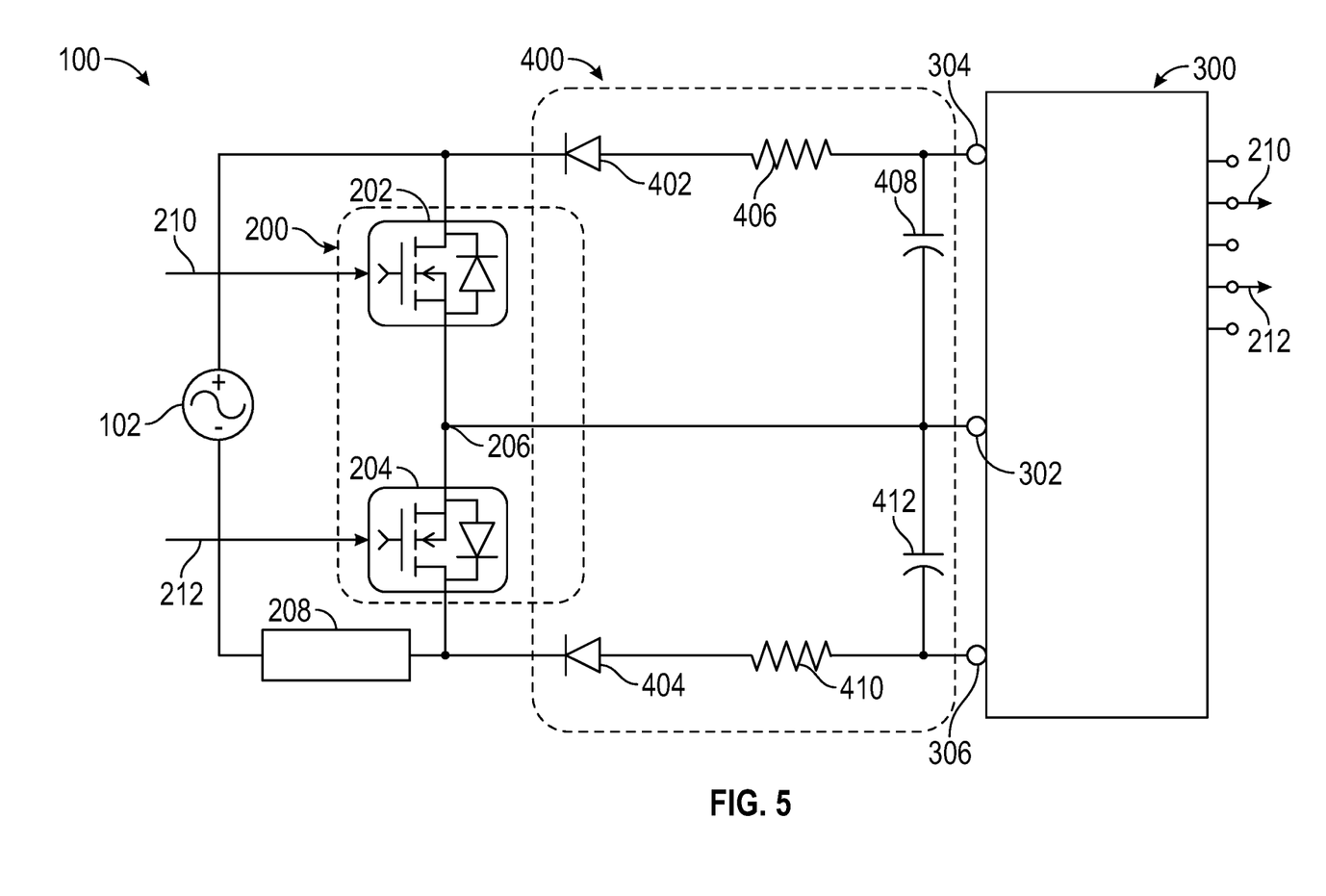
FIG. 5 is a schematic diagram of a bidirectional switch fault protection circuit according to another non-limiting embodiment of the subject disclosure.

Turning now FIG. 5, a bidirectional switch fault protection circuit 100 is illustrated according to another non-limiting embodiment of the present disclosure. The bidirectional switch fault protection circuit 100 includes a power supply 102, a bidirectional switch circuit 200, a gate driver 300, and a desaturation detection circuit 400. The power supply 102 and the bidirectional switch circuit 200 operate in a similar manner as described above. Therefore, details of their operation will not be repeated for the sake of brevity.

The gate driver 300 includes a source input 302 (Vsource_IN), a first desaturation input (DSAT1) 304, and a second desaturation input (DSAT2) 306. The source input (Vsource_IN) 302 is connected to the source node 206 to receive a source voltage present at the source node 206. Accordingly, the gate driver 300 includes dedicated desaturation inputs 304 and 306 configured to receive the first and second switch voltages, respectively, rather than a single desaturation input 304 configured to receive both the first and second switch voltages.

For example, the first desaturation input (DSAT1) 304 is configured to receive a first switch voltage associated with the first MOSFET 202 when the electric current flows through the bidirectional switch circuit 200 in the first direction (e.g., from the power supply positive terminal (+) to the power supply negative terminal (−)). The second desaturation input (DSAT2) 306 is configured to receive the second switch voltage associated with the second MOSFET 204 when the electric current flows through the bidirectional switch circuit 200 in the second direction (e.g., from the power supply negative terminal (−) to the power supply positive terminal (+)).

As described herein, the gate driver 300 also has an internal reference voltage that serves as a short circuit threshold voltage. In the example, however, the threshold voltage is a positive value. Accordingly, the gate driver 300 is configured to compare the first switch voltage and the second switch voltage to the threshold reference voltage and detect the short circuit event in response to at least one of the first or second switch voltages exceeding (e.g., being more positive) the threshold reference voltage.

The desaturation detection circuit 400 includes a first desaturation diode 402, a second desaturation diode 404, a first desaturation resistor 406, a second desaturation resistor 410, a first desaturation capacitor 408, and a second desaturation capacitor 412. The first desaturation diode 402 includes a first cathode connected in common with the first drain terminal of the first MOSFET 202 and the positive terminal (+) of the power supply 102. The anode of the first desaturation diode 402 is connected to the first desaturation resistor 406. The second desaturation diode 404 includes a second cathode connected in common with the load 208 and the second drain terminal of the second MOSFET 204. The anode of the second desaturation diode 404 is connected to the second desaturation resistor 410.

The first desaturation resistor 406 includes a first terminal connected to the first desaturation input (DSAT1) 304 and a second terminal connected directly to the anode of the first desaturation diode 402. The first desaturation resistor 406 fine-tunes the first switch voltage delivered by the first MOSFET 202 before delivering it across the first desaturation capacitor 408. As described herein, the first resistance value can be selected by implementing a resistor having a resistance targeted for the particular application of the bidirectional switch fault protection circuit 100 or can be implemented as a variable resistor having a resistance that can be dynamically adjusted.

The second desaturation resistor 410 includes a first terminal connected to the second desaturation input (DSAT2) 306 and a second terminal connected directly to the anode of the second desaturation diode 404. The second desaturation resistor 410 fine-tunes the second switch voltage delivered by the second MOSFET 204 before delivering it across the second desaturation capacitor 412. A second resistance value of the second desaturation resistor 410 also sets a resistance at the second desaturation input (DSAT2) 306 of the gate driver 300. As described herein, the second resistance value can be selected by implementing a resistor having a resistance targeted for the particular application of the bidirectional switch fault protection circuit 100 or can be implemented as a variable resistor having a resistance that can be dynamically adjusted. In either instance, the selected resistance of the second desaturation resistor 410 can be utilized to adjust the internal reference voltage of the gate driver 300 and set a second threshold reference voltage to a targeted positive value. By providing first and second desaturation inputs 304 and 306, the first and second threshold reference voltages can be set independently from one another. According to at least one non-limiting embodiment of the present disclosure, the first threshold reference voltage of the first gate driver 300 can be set to a first threshold value while the second threshold reference voltage of the second gate driver 350 can be set to a second threshold value different from the first threshold value. In this manner, the short circuit detection provided by the bidirectional switch fault protection circuit 100 can be precisely tuned even if the first and second MOSFETs 202 and 204 are not identical.

The first desaturation capacitor 408 includes a first terminal connected in common with the first desaturation input (DSAT1) 304 and the first terminal of the first desaturation resistor 406. The opposing second terminal of the first desaturation capacitor 408 is connected in common with the source node 206, the source input (Vsource_IN) 302, and the second desaturation capacitor 412. Accordingly, the first switch voltage generated by the first MOSFET 202 appears across the first desaturation capacitor 408, and is input to the gate driver 300 via the first desaturation input (DSAT1) 304. Accordingly, the gate driver 300 compares the first switch voltage received at the first desaturation input (DSAT1) 304 against the voltage appearing at the source input (Vsource_In) 302 to detect an occurring short circuit associated with the first MOSFET 202. The first desaturation capacitor 408 further operates to provide a blanking time so that high switch voltages or transients associated with the first MOSFET 202 do not cause a false short circuit detection.

The second desaturation capacitor 412 includes a first terminal connected in common with the second desaturation input (DSAT2) 306 and the first terminal of the second desaturation resistor 410. The opposing second terminal of the desaturation capacitor 412 is connected in common with the source node 206, the source input (Vsource_IN) 302, and the second terminal of the first desaturation capacitor 408. The second switch voltage generated by the second MOSFET 204 appears across the second desaturation capacitor 412, and is input to the gate driver 300 via the second desaturation input (DSAT2) 306. Accordingly, the gate driver 300 compares the second switch voltage received at the second desaturation input (DSAT2) 306 against the voltage appearing at the source input (Vsource_In) 302 to detect an occurring short circuit fault associated with the second MOSFET 204. The second desaturation capacitor 412 further operates to provide a blanking time so that high switch voltages or transients associated with the second MOSFET 204 do not cause a false short circuit detection.

As described herein, the desaturation detection circuit 400 provides the first and second switch voltages to the gate driver 300. When the current flows in the positive direction, the first switch voltage generated by the first MOSFET 202 is positive and appears across the first desaturation capacitor 408 before being input to the first desaturation input (DSAT1) 304. In addition, the second switch voltage generated by the second MOSFET 204 is negative and appears across the second desaturation capacitor 412 before being input to the second desaturation input (DSAT2) 306. In this example, the gate driver 300 utilizes the first switch voltage generated by the first MOSFET 202 to detect a short circuit fault. A short circuit fault is not triggered at the second desaturation input (DSAT2) 306 because the short circuit threshold is set to a positive threshold value and is always higher than the second switch voltage when the current flows through the bidirectional switch circuit 200 in the negative direction.

When the current flows through the bidirectional switch circuit 200 in the negative direction, the second switch voltage generated by the second MOSFET 204 is positive, while the first switch voltage generated by the first MOSFET 202 is negative. Accordingly, the gate driver 300 utilizes the second switch voltage generated by the second MOSFET 204 to detect a short circuit fault. A short circuit fault is not triggered at the first desaturation input (DSAT1) in this example because the short circuit threshold is set to a positive threshold value and is always higher than the negative first switch voltage when the current flows through the bidirectional switch circuit 200 in the negative direction.

With continued reference to FIG. 5, the gate driver 300 compares the first switch voltage to the first threshold reference voltage and compares the second switch voltage to the second threshold reference voltage (e.g., a positive threshold reference voltage value in this example). If both the first and second threshold reference voltages are set to positive 2.5 volts (2.5V) for the example embodiment illustrated in FIG. 5, the gate driver 300 detects a short circuit condition when either the first switch voltage reaches a voltage level beyond 2.5V, (e.g., if the first switch voltage reaches a voltage level of positive 3 volts (3V)), or if the second switch voltage reaches a voltage level beyond 2.5V, (e.g., if the second switch voltage reaches a voltage level of positive 3 volts (3V)). In response to detecting the short circuit, the gate driver 300 can deactivate one or both of the first and second MOSFETs 202 and 204 as described herein. In this manner, the gate driver 300 can perform desaturation voltage-based protection for the bidirectional switch circuit in response to detecting short circuit current flowing in either a positive direction or negative direction.

Figure 6:
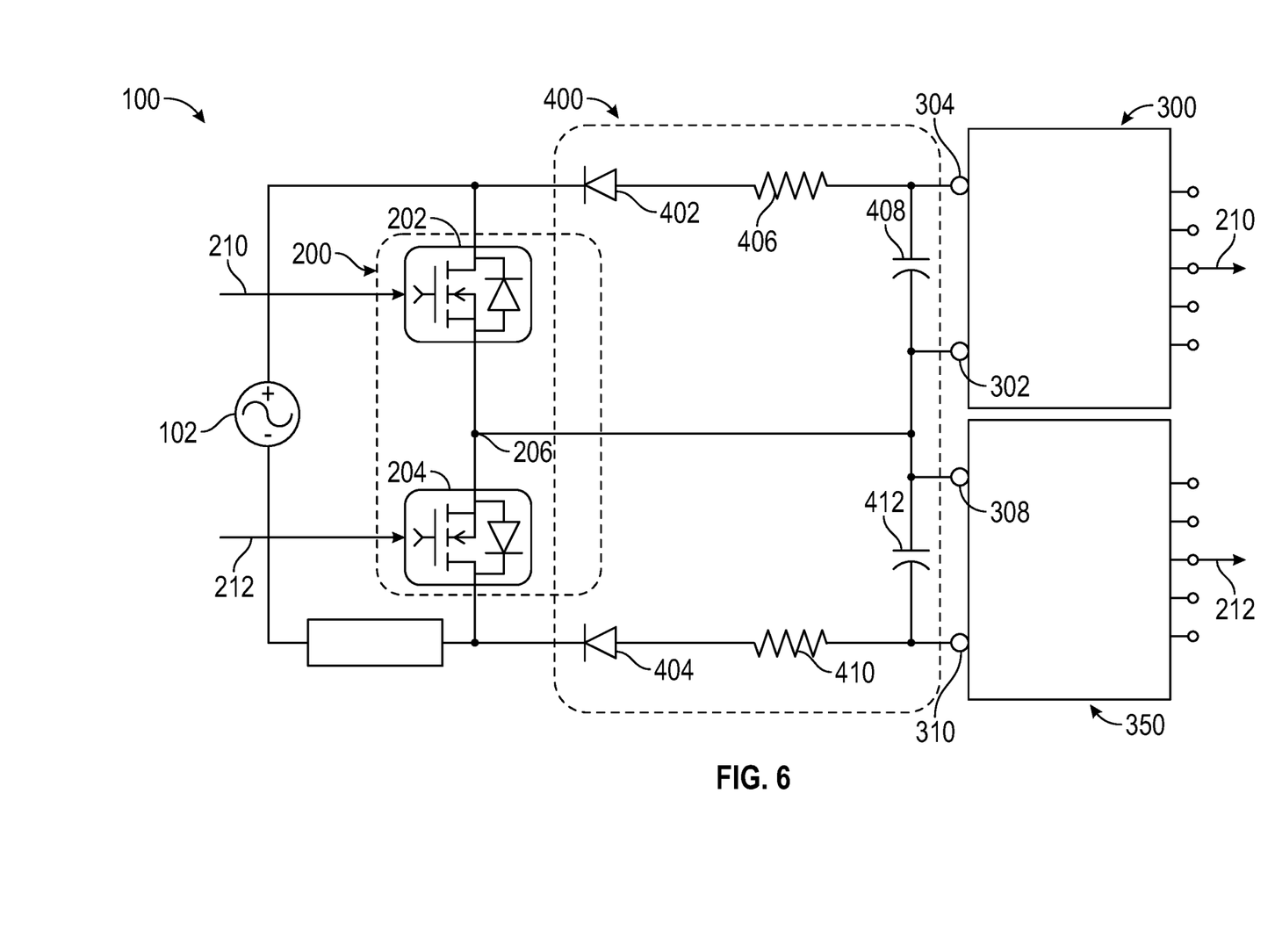
FIG. 6 is a schematic diagram of a bidirectional switch fault protection circuit according to another non-limiting embodiment of the subject disclosure.

With reference now to FIG. 6, a bidirectional switch fault protection circuit 100 is illustrated according to another non-limiting embodiment of the present disclosure. The bidirectional switch fault protection circuit 100 includes a power supply 102, a bidirectional switch circuit 200, a first gate driver 300, a second gate driver 350, and a desaturation detection circuit 400. The power supply 102, bidirectional switch circuit 200, and desaturation detection circuit 400 operate in a similar manner as described above. Therefore, details of their operation will not be repeated for the sake of brevity.

The first gate driver 300 is in signal communication with the bidirectional switch circuit 200 and the desaturation detection circuit 400. The first gate driver 300 is configured to receive the first switch voltage generated by the first MOSFET 202. The second gate driver 350 is also in signal communication with the bidirectional switch circuit 200 and the desaturation detection circuit 400, but is configured to receive the second switch voltage generated by the second MOSFET 204. Accordingly, the first gate driver 300 detects a short circuit fault condition based on the first switch voltage, while the second gate driver 350 detects a short circuit fault condition based on the second switch voltage.

With continued reference to the example embodiment illustrated in FIG. 6, the first gate driver 300 includes a first source input (Vsource_IN1) 302 and a first desaturation input (DSAT1) 304. The first source input (Vsource_IN1) 302 is connected to the source node 206 to receive a source voltage present at the source node 206.

The first desaturation input (DSAT1) 304 receives a positive switch voltage generated by the first MOSFET 202 in response to the electric current flowing through the bidirectional switch circuit 200 in the first direction (e.g., from the power supply positive terminal (+) to the power supply negative terminal (−)), and receives a negative switch voltage generated by the first MOSFET 202 in response to the current flowing through the bidirectional switch circuit 200 in the second direction (e.g., from the power supply negative terminal (−) to the power supply positive terminal (+)).

The first gate driver 300 also has a first internal reference voltage threshold that serves as a first short circuit threshold voltage, which in this example is a positive value. Accordingly, the first gate driver 300 is configured to compare the first switch voltage to its first internal reference voltage threshold and detect a short circuit in response to the first switch voltage exceeding (e.g., being more positive) the a first internal reference voltage threshold. When, however, the current flows through the bidirectional switch circuit 200 in the second direction (e.g., (e.g., from the power supply negative terminal (−) to the power supply positive terminal (+)), and receives a negative switch voltage generated by the first MOSFET 202. As a result, a short circuit fault is not triggered at the first desaturation input (DSAT1) because the first internal reference voltage threshold is set to a positive threshold value and is always higher than the negative first switch voltage generated when the current flows through the bidirectional switch circuit 200 in the negative direction.

With continued referenced to FIG. 6, the second gate driver 350 includes a second source input (Vsource_IN2) 308 and a second desaturation input (DSAT2) 310. The second source input (Vsource_IN2) 308 is also connected to the second source node 206 to receive the source voltage present at the source node 206. Accordingly, the first and second gate drivers 300 and 350 receive a common source voltage present on the source node 206. The second desaturation input (DSAT2) 310 receives a positive switch voltage generated by the second MOSFET 204 in response to the electric current flowing through the bidirectional switch circuit 200 in the second direction (e.g., in a negative direction from the power supply positive terminal (−) to the power supply negative terminal (+)), and receives a negative switch voltage generated by the second MOSFET 204 in response to the current flowing through the bidirectional switch circuit 200 in the first direction (e.g., in a positive direction from the power supply positive terminal (+) to the power supply negative terminal (−)).

The second gate driver 350 also has a second internal reference voltage threshold that serves a second short circuit voltage threshold, which in this example is a positive value. The second gate driver 350 is configured to compare a positive switch voltage generated by the second MOSFET 204 to its internal reference voltage threshold in response to the electric current flowing through the bidirectional switch circuit 200 in the negative direction and detect a short circuit in response to the second switch voltage exceeding (e.g., being more positive) its second internal reference voltage threshold. When, however, the current flows through the bidirectional switch circuit 200 in the positive direction, the second desaturation input (DSAT2) 310 receives a negative switch voltage generated by the second MOSFET 204. As a result, a short circuit fault is not triggered at the second desaturation input (DSAT2) 310 because the positive value of the gate driver internal reference voltage threshold is always higher than the negative switch voltage generated by the second MOSFET 204 when the current flows through the bidirectional switch circuit 200 in the positive direction.

Both the first gate driver 300 and the second gate driver 350 are configured to control the first and second MOSFETs 202 and 204 in response to detecting a fault condition, (e.g., a short circuit condition). For example, the first gate driver 300 includes a first output in signal communication with the first MOSFET 202 to deliver a first control signal 210. Accordingly, the first gate driver 300 is configured to switch off (i.e., deactivate) the first MOSFET 202 in response to detecting a short circuit. Similarly, the second gate driver 350 further includes a second output in signal communication with the second MOSFET 204 to deliver a second control signal 212. Accordingly, the second gate driver 350 is configured to switch off (i.e., deactivate) the second MOSFET 204 in response to detecting a short circuit fault. In this manner, the gate drivers 300 and 350 can perform desaturation voltage-based protection for the bidirectional switch circuit in response to detecting short circuit current flowing in either a positive direction or negative direction.

As described herein, various non-limiting embodiments of the subject disclosure provide a bidirectional switch fault protection circuit that includes a desaturation detection circuit facilitating electrical connection between a bidirectional switch circuit and one or more gate drivers configured to provide desaturation, bidirectional short circuit or over current protection. One or more of the gate drivers included in the bidirectional switch fault protection circuit are configured to perform desaturation voltage-based protection for the bidirectional switch circuit in response to detecting short circuit current flowing in either a positive direction or negative direction.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A bidirectional switch fault protection circuit comprising:
   a bidirectional switch circuit configured to generate a first switch voltage in response to receiving an electric current flowing in a first direction and to generate a second switch voltage in response to receiving the electric current flowing in a second direction opposite the first direction;
   a desaturation detection circuit electrically connected to the bidirectional switch circuit, the desaturation detection circuit configured to output the first switch voltage in response to the electric current flowing in the first direction and to output the second switch voltage in response to the electric current flowing in the second direction; and
   a gate driver electrically connected to the desaturation detection circuit, the gate driver configured to receive the first switch voltage in response to the electric current flowing in the first direction and to receive the second switch voltage in response to the electric current flowing in the second direction, and configured to detect a first short circuit condition based on the first switch voltage and a second short circuit condition based on the second switch voltage.

2. The bidirectional switch fault protection circuit of claim 1, wherein the gate driver is configured to compare the first switch voltage to a short circuit voltage threshold in response to the electric current flowing in the first direction, and to detect the first short circuit condition in response to the first switch voltage exceeding the short circuit voltage threshold; and
   wherein the gate driver is configured to compare the second switch voltage to the short circuit voltage threshold in response to the electric current flowing in the second direction, and to detect the second short circuit condition in response to the second switch voltage exceeding the short circuit voltage threshold.

3. The bidirectional switch fault protection circuit of claim 2, wherein the short circuit voltage threshold has a negative value.

4. The bidirectional switch fault protection circuit of claim 2, wherein the gate driver includes an output electrically connected to the bidirectional switch circuit, and wherein the gate driver is configured to switch off one or both of the first and second switch voltages in response to detecting one or both of the first short circuit condition and the second short circuit condition.

5. The bidirectional switch fault protection circuit of claim 4, wherein the bidirectional switch circuit comprises:
   a first power semiconductor switch configured to generate the first switch voltage; and
   a second power semiconductor switch configured to generate the second switch voltage.

6. The bidirectional switch fault protection circuit of claim 5, wherein the gate driver is configured to switch off one or both of the first power semiconductor switch and the second power semiconductor switch in response to detecting one or both of the first short circuit condition and the second short circuit condition.

7. The bidirectional switch fault protection circuit of claim 5, wherein the gate driver includes a desaturation input, the desaturation input electrically connected to the first power semiconductor switch to receive the first switch voltage having a negative voltage value and electrically connected to the second power semiconductor switch to receive the second switch voltage having a negative voltage value.

8. A bidirectional switch fault protection circuit comprising:
   a bidirectional switch circuit configured to generate a first switch voltage in response to receiving an electric current flowing in a first direction and to generate a second switch voltage in response to receiving the electric current flowing in a second direction opposite the first direction;
   a desaturation detection circuit electrically connected to the bidirectional switch circuit, the desaturation detection circuit configured to output the first switch voltage in response to the electric current flowing in the first direction and to output the second switch voltage in response to the electric current flowing in the second direction; and
   a gate driver electrically connected to the desaturation detection circuit, the gate driver including a first desaturation input configured to receive the first switch voltage in response to the electric current flowing in the first direction, and including a second desaturation input configured to receive the second switch voltage in response to the electric current flowing in the second direction.

9. The bidirectional switch fault protection circuit of claim 8, wherein the gate driver is configured to detect a first short circuit condition based on the first switch voltage received at the first desaturation input and a second short circuit condition based on the second switch voltage received at the second desaturation input.

10. The bidirectional switch fault protection circuit of claim 9, wherein the gate driver is configured to compare the first switch voltage received at the first desaturation input to a first short circuit voltage threshold and to compare the second switch voltage received at the second desaturation input to a second short circuit voltage threshold, and
    wherein the gate driver is configured to detect the first short circuit condition in response to the first switch voltage exceeding the first short circuit voltage threshold and to detect the second short circuit condition in response to the second switch voltage exceeding the second short circuit voltage threshold.

11. The bidirectional switch fault protection circuit of claim 10, wherein the first short circuit voltage threshold and the second short circuit voltage threshold each have a positive value.

12. The bidirectional switch fault protection circuit of claim 10, wherein the bidirectional switch circuit comprises:
    a first power semiconductor switch configured to generate the first switch voltage; and
    a second power semiconductor switch configured to generate the second switch voltage.

13. The bidirectional switch fault protection circuit of claim 12, wherein the gate driver is configured to switch off one or both of the first power semiconductor switch and the second power semiconductor switch in response to detecting one or both of the first short circuit condition and the second short circuit condition.

14. The bidirectional switch fault protection circuit of claim 13, wherein the gate driver includes a first output electrically connected to the first power semiconductor switch and a second output electrically connected to the second power semiconductor switch, and wherein the gate driver is configured to switch off the first power semiconductor switch in response to detecting the first short circuit condition and to switch off the second power semiconductor switch in response to detecting the second short circuit condition.

15. A bidirectional switch fault protection circuit comprising:
a bidirectional switch circuit configured to generate a first switch voltage in response to receiving an electric current flowing in a first direction and to generate a second switch voltage in response to receiving the electric current flowing in a second direction opposite the first direction;
a desaturation detection circuit electrically connected to the bidirectional switch circuit, the desaturation detection circuit configured to output the first switch voltage in response to the electric current flowing in the first direction and to output the second switch voltage in response to the electric current flowing in the second direction;
a first gate driver electrically connected to the desaturation detection circuit, the first gate driver configured to receive the first switch voltage in response to the electric current flowing in the first direction; and
a second gate driver electrically connected to the desaturation detection circuit, the second gate driver configured to receive the second switch voltage in response to the electric current flowing in the second direction.

16. The bidirectional switch fault protection circuit of claim 15, wherein the first gate driver is configured to detect a first short circuit condition based on the first switch voltage, and wherein the second gate driver is configured to detect a second short circuit condition based on the second switch voltage.

17. The bidirectional switch fault protection circuit of claim 16, wherein the first gate driver is configured to compare the first switch voltage to a first short circuit voltage threshold, and is configured to detect the first short circuit condition in response to the first switch voltage exceeding the first short circuit voltage threshold, and
wherein the second gate driver is configured to compare the second switch voltages to a second short circuit voltage threshold, and is configured to detect the second short circuit condition in response to the second switch voltage exceeding the second short circuit voltage threshold.

18. The bidirectional switch fault protection circuit of claim 17, wherein the first short circuit voltage threshold and the second short circuit voltage threshold each have a positive value.

19. The bidirectional switch fault protection circuit of claim 17, wherein the bidirectional switch circuit comprises:
a first power semiconductor switch configured to generate the first switch voltage; and
a second power semiconductor switch configured to generate the second switch voltage.

20. The bidirectional switch fault protection circuit of claim 19, wherein the first gate driver is configured to switch off the first power semiconductor switch in response to detecting the first short circuit condition, and wherein the second gate driver is configured to switch off the second power semiconductor switch in response to detecting the second short circuit condition.

* * * * *